(12) United States Patent
Konisi et al.

(10) Patent No.: US 6,181,921 B1
(45) Date of Patent: Jan. 30, 2001

(54) BROADCASTING STATION DATA DETECTOR AND BROADCAST RECEIVER FOR MOVING BODY THAT SEARCH A CHANNEL MAP BASED ON LOCATION

(75) Inventors: Masanori Konisi; Sinji Kubota, both of Suwa (JP)

(73) Assignee: Seiko Epson Corporation, Tokyo (JP)

( * ) Notice: Under 35 U.S.C. 154(b), the term of this patent shall be extended for 0 days.

(21) Appl. No.: 08/632,404

(22) PCT Filed: Aug. 10, 1995

(86) PCT No.: PCT/JP95/01597

§ 371 Date: Apr. 17, 1996

§ 102(e) Date: Apr. 17, 1996

(87) PCT Pub. No.: WO96/06485

PCT Pub. Date: Feb. 29, 1996

(30) Foreign Application Priority Data

Aug. 19, 1994 (JP) .................................................. 6-217938

(51) Int. Cl.[7] .................................................... H04B 1/18
(52) U.S. Cl. ...................... 455/186.2; 455/158.1; 455/161.2; 455/161.3; 455/185.1; 348/725
(58) Field of Search ........................ 455/186.1, 186.2, 455/185.1, 179.1, 161.1–161.3, 162.3, 158.1, 158.4, 158.5, 156.1, 457, 456; 381/17; 348/725, 731, 732

(56) References Cited

U.S. PATENT DOCUMENTS

| | | | |
|---|---|---|---|
| 5,086,511 | * | 2/1992 | Kobayashi et al. ................ 455/156.1 |
| 5,220,682 | * | 6/1993 | Tomohiro ....................... 455/186.1 X |
| 5,307,513 | | 4/1994 | Harada ............................... 455/186.1 |
| 5,349,386 | * | 9/1994 | Borchardt et al. ................. 381/14 X |
| 5,393,713 | * | 2/1995 | Schwob ............................. 455/186.1 |
| 5,497,372 | * | 3/1996 | Nankoh et al. ............... 455/158.4 X |
| 5,673,305 | * | 9/1997 | Ross ................................. 455/457 X |

FOREIGN PATENT DOCUMENTS

| | | |
|---|---|---|
| 0 352 764 | 1/1990 | (EP) . |
| 0 387 810 | 9/1990 | (EP) . |
| 2 644 019 | 9/1990 | (FR) . |
| 59-225621 | 12/1984 | (JP) . |
| 1-276829 | 11/1989 | (JP) . |
| 4-25332 U | 2/1992 | (JP) . |
| 4-233818 | 8/1992 | (JP) . |
| WO 90/04293 | 4/1990 | (WO) . |
| WO 91/07029 | 5/1991 | (WO) . |

* cited by examiner

Primary Examiner—Wellington Chin
Assistant Examiner—Philip J. Sobutka
(74) Attorney, Agent, or Firm—Oliff & Berridge, PLC

(57) ABSTRACT

The present invention provides a system for a moving body which enables a user to know a receivable broadcast station at the current position in real time and to select smoothly a desired broadcast station in a receiver even in an unfamiliar area. This system includes a broadcast station data memory that stores the channel data of a receivable broadcast station for each area, and a main processing circuit which is responsive to the vehicle's current position sensed by a coordinate computing unit for referring to the channel data and for showing the channel data of a receivable broadcast station at the current position on a display.

32 Claims, 11 Drawing Sheets

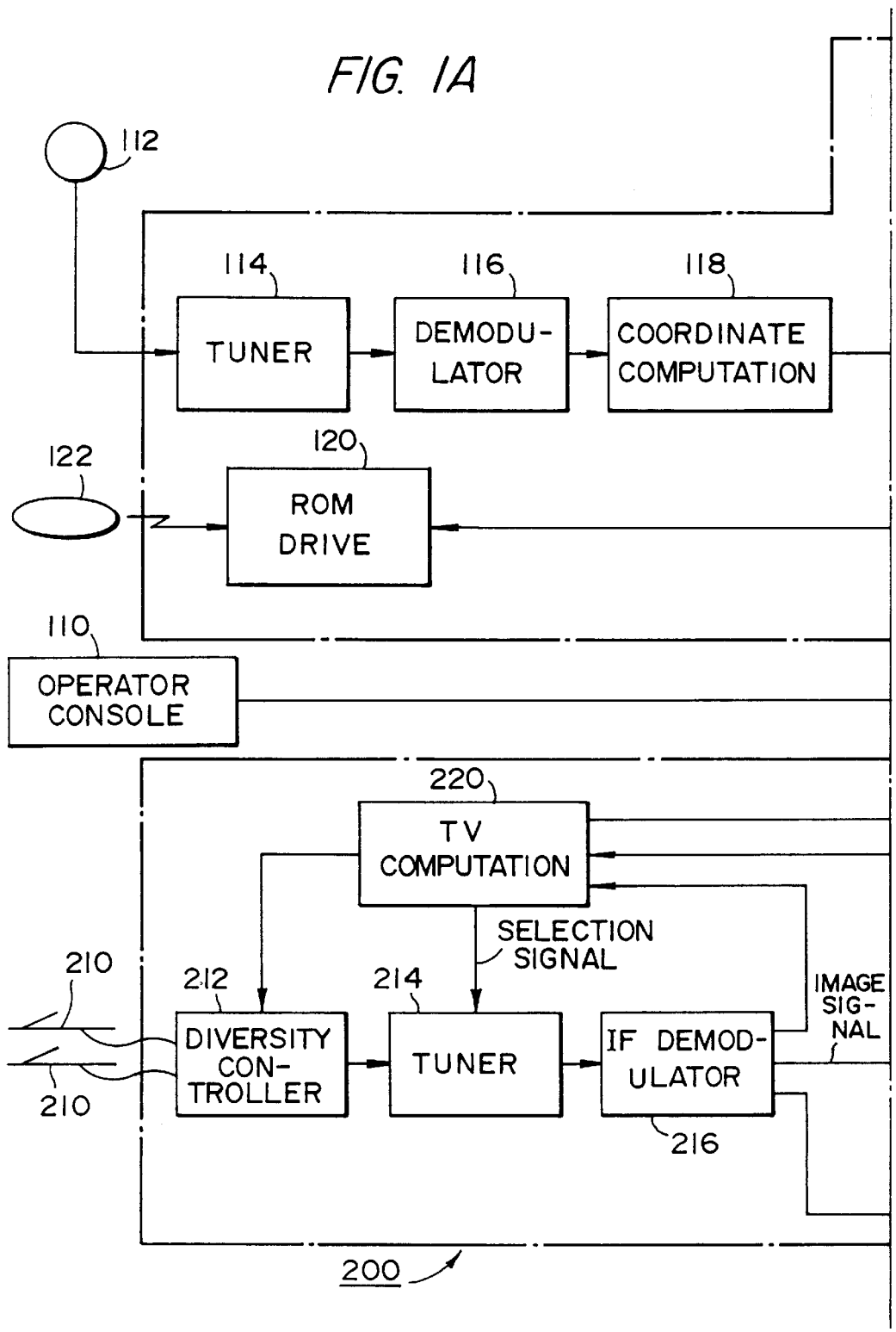

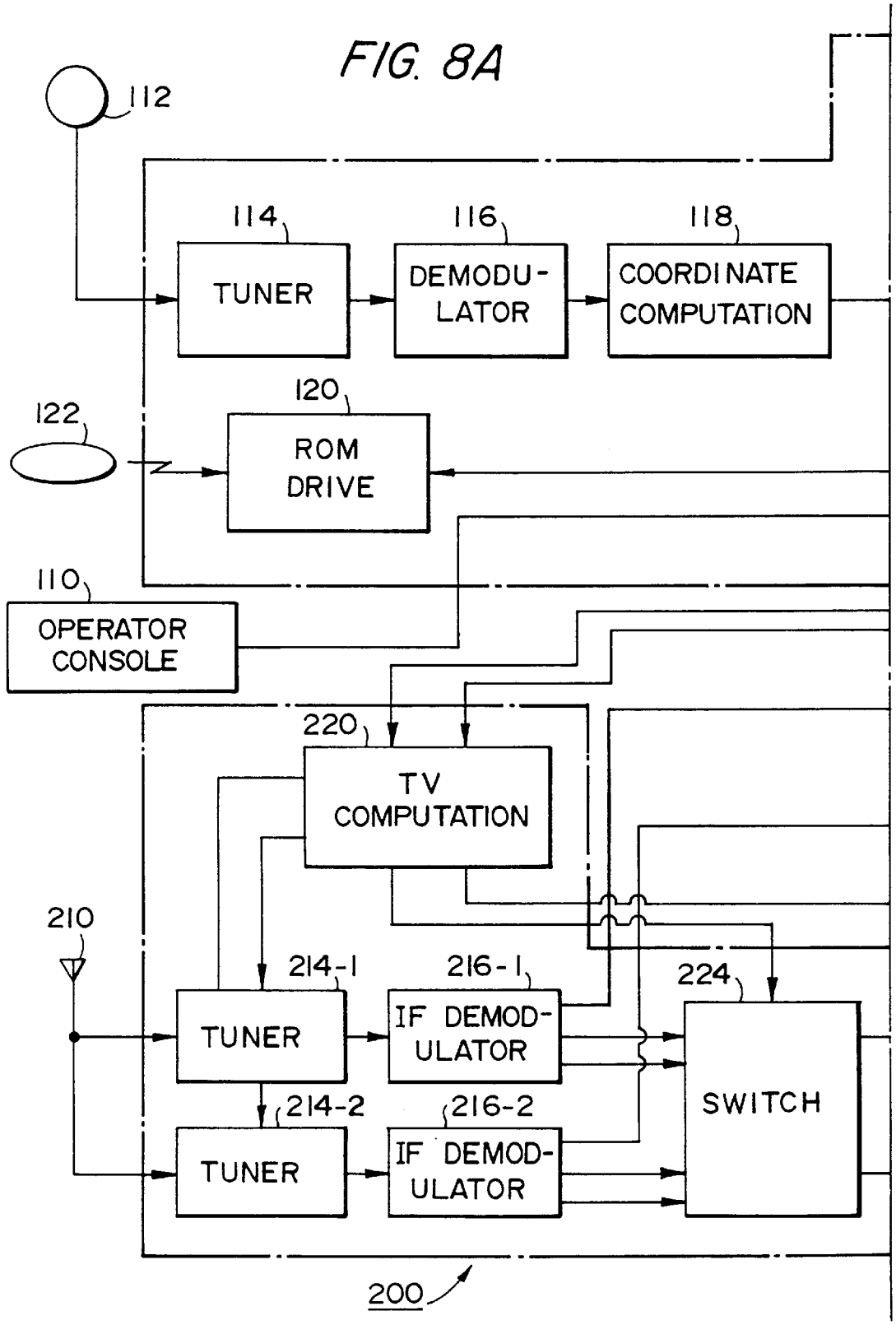

BROADCASTING STATION DATA DETECTOR AND BROADCAST RECEIVER FOR MOVING BODY THAT SEARCH A CHANNEL MAP BASED ON LOCATION

TECHNICAL FIELD

The present invention relates to a broadcast station data detector and broadcast receiver for a moving body.

BACKGROUND OF ART

Navigation Systems are broadly used in various fields such as ships and vehicles, because they can sense the position of a moving body and show it on a display in real time.

Presumably, the navigation systems will spread increasingly for they can sense accurately the position of a moving body utilizing radio waves from Global Positioning System satellites, and with the technical developments of liquid crystal displays as well as the cost and size reduction of integrated circuits.

The conventional navigation systems provide an excellent navigation for showing the positions of a moving body, but do not accommodate navigation data for receiving broadcast waves and selecting broadcast stations.

For example, a vehicle includes a broadcast wave receiver such as a TV set or radio set to create a pleasant atmosphere. Particularly, vehicles on which the navigation systems are mounted often include TV sets.

Supposing that a vehicle is moving on an expressway surrounded by many mountains from a point A (e.g. Tokyo City) to another point B (e.g. Matsumoto City). The driver decides to take a break at a service area, and to watch TV in the vehicle. Being unfamiliar with the area, he is unaware of which TV broadcasts are receivable through which TV channels as it is often the case that different channels transmit different broadcasts for every geographic area. Thus, the driver would have to change the channels and find the receivable TV broadcasts in vain, making the TV station selection complicated.

Furthermore, assuming that a sightseeing bus including a TV set is moving while the television is on. Frequently, TV broadcast reception gradually degrades and in worst cases, the TV broadcast becomes invisible. For example, the nation-wide TV broadcast waves from Japan Broadcasting Corporation (NHK) may be received through different channels in different areas. Therefore, if a vehicle is moving while the NHK TV broadcast is on, the TV broadcast wave reception may gradually degrade and the images may become invisible. In such a case, if the TV channels are automatically switched depending on the area in which the vehicle is moving, the TV broadcasts may be transmitted in a desired condition. However, the prior art does not provide such a TV broadcast receiver.

In view of such problems in the prior art, an object of the present invention is to provide an improved broadcast station data detector and broadcast receiver for a moving body, which can utilize the positional data of the moving body to know a receivable broadcast station at the position of the moving body in real time, whereby even a user unfamiliar with the area can smoothly select the receivable broadcast station.

Another object of the present invention is to provide a broadcast receiver which can utilize the positional data of the moving body to switch the channels automatically and to obtain a desired broadcast reception.

DISCLOSURE OF THE INVENTION

To this end, the present invention provides a broadcast station data detector for a moving body, comprising:
  position sensing means for sensing a position of a moving body;
  a broadcast station data memory which stores channel data of a receivable broadcast station for each area; and
  broadcast station data searching means for referring to data in the broadcast station data memory based on a sensed position of the moving body and for reporting the receivable broadcast station at the sensed position to a user.

In the broadcast station data detector of the present invention, the broadcast station data memory stores the channel data of a receivable broadcast station for each area. For example, the channel data may include receivable channel data for each section in Tokyo City, receivable channel data for each section in Yamanashi Prefecture adjacent to Tokyo City, and receivable channel data for each section in Nagano Prefecture adjacent to Yamanashi Prefecture.

Based on the current position of the moving body, the broadcast station data searching means refers to the broadcast station data memory and reports to the user the channel data of a broadcast station which may be received at the current position. At this point, the channel data may be shown on a display or announced as sounds.

Thus, when the position of the moving body is sensed, it is possible to report the channel data of the receivable broadcast station to the user in real time. For example, when a vehicle moves on an expressway from Tokyo City toward Nagano Prefecture and passes Hachioji City surrounded by mountains the TV broadcast reception degrades. In such a case, the broadcast station data detector of the present invention may find and select a receivable broadcast station in the area, and set it to the corresponding channel.

When the vehicle moves from Yamanashi Prefecture toward Nagano Prefecture, receivable broadcast stations vary continuously. Nevertheless, the broadcast station data detector of the present invention is very convenient, since it can find a receivable broadcast station substantially in real time.

Thus, according to the present invention a navigation system can utilize positional data to know a receivable broadcast station at the current position of a moving body in real time. Therefore, a user can smoothly select a broadcast station in an unfamiliar area.

It is preferable that the broadcast station data detector also comprises input means for inputting a search command and wherein the broadcast station data searching means is responsive to the search command to report channel data of a receivable broadcast station to the user.

When such input means is used to input the search command into the broadcast station data detector, it is possible to know necessary channel data at the desired timing.

It is also preferable that the broadcast station data detector further comprises means for reporting information to the user through at least images or sounds and wherein the broadcast station data searching means reports the channel data of the receivable broadcast station to the user through the reporting means.

It is further preferable that the reporting means includes image display means mounted on a moving body for showing images representing the channel data of the receivable broadcast station.

The reporting means may include sound generating means mounted on a moving body to output the channel data of the receivable broadcast station as sounds.

It is further preferable that the broadcast station data memory stores channel data of a receivable broadcast station for each area and the broadcast station data searching means is responsive to a sensed position of the moving body for referring to the data of the broadcast station data memory and for reporting a channel of a receivable broadcast station at the sensed position to the user.

The present invention also provides a broadcast wave receiver for a moving body, which includes the aforementioned broadcast station data detector of the present invention.

The broadcast wave receiver for a moving body comprises:

position sensing means for sensing a position of a moving body;

a broadcast station data memory which stores channel data of a broadcast station or affiliates thereof allocated to each area as channel map data for the broadcast station or affiliates thereof;

input means for inputting a selection command for selecting a broadcast station;

channel determining means responsive to the sensed position of the moving body and the selection command for referring to the data of the broadcast station data memory and for determining a reception channel of a selected broadcast station at the sensed position; and means for receiving broadcast waves through the determined reception channel.

For example, while the NHK TV broadcast is allocated to the first channel in Tokyo, it is often allocated to the eighth or other channel in other locations. Thus, the broadcast station data memory stores the reception channel data of the NHK TV broadcast allocated to each area as the channel map data of the NHK TV broadcast.

If the reception area is divided into sections by mountains, a local broadcast station may have different channels allocated to the respective sections. In such a case, the broadcast station data memory stores the reception channel data allocated to the respective sections as the channel map data of the local broadcast station.

Furthermore, it is often the case that a key Tokyo station and its local stations simultaneously broadcast the same program. In such a case, the broadcast station data memory stores the reception channel data allocated to the respective areas as the channel map data of the key and local stations.

When the user inputs a given selection command, the channel determining means is responsive to the sensed position of the moving body and the selection command for referring to the broadcast station data memory and for determining the reception channel of a selected broadcast station.

It is now assumed that the first channel allocated to the NHK TV broadcast is selected. As the vehicle moves, the channel determining means is responsive to the current sensed position of the moving vehicle for sensing the channel set for the NHK TV broadcast at that position. When the vehicle enters an area in which the eighth channel has been set for the NHK TV broadcast, the broadcast wave receiving system will switch the first to the eighth reception channel.

In such a manner, it is possible to receive the NHK TV broadcast continuously in a good condition.

Thus, according to the present invention, it is possible to refer to the broadcast station data memory based on the position of the moving body and the user's selection command, so as to set automatically the reception channel at the moving body's current position. Therefore, it is possible to obtain the broadcast wave receiver for a moving body which is capable of receiving the broadcast waves from a selected broadcast station in a good condition at all times, even when the moving body is moving.

It is preferable that the broadcast station data memory stores channel data of a receivable broadcast station allocated for each area and the broadcast wave receiver includes broadcast station data searching means responsive to the sensed position of the moving body for referring to the broadcast station data memory and for reporting to the user a channel of a receivable broadcast station at the sensed position of the moving body.

It is also preferable that the broadcast wave receiver for a moving body comprises input means for inputting a search command and wherein the broadcast station data searching means is responsive to the search command for reporting channel data of a receivable broadcast station to the user.

It is further preferable that the broadcast wave receiver for a moving body comprises means for reporting information to the user through at least images or sounds and wherein the broadcast station data searching means reports channel data of the receivable broadcast station to the user through the reporting means.

It is further preferable that the reporting means includes image display means mounted on a moving body for showing images representing the channel data of the receivable broadcast station.

It is further preferable that the reporting means includes sound generating means mounted on a moving body to output the channel data of the receivable broadcast station as sounds.

It is further preferable that the broadcast station data memory stores channel data of a receivable broadcast station allocated to each area, the input means inputs a selection command for any TV broadcast station, the channel determining means is responsive to the sensed position of the moving body and the selection command for referring to the data of the broadcast station data memory and for determining a reception channel of a selected TV broadcast station at the sensed position of the moving body, and the broadcast wave receiving means receives TV broadcast waves from the selected broadcast station through a determined broadcast channel.

It is further preferable that the broadcast wave receiver for a moving body includes image display means for showing images which constitute the received TV broadcast waves.

It is further preferable that the broadcast wave receiver includes a radio set mounted on the moving body and transmitting means for wirelessly transmitting sound signals which constitute the received TV broadcast waves to the radio set, whereby the radio set outputs the sound signals from a sound generating portion.

It is further preferable that the broadcast wave receiver for a moving body includes an unused wave data memory which stores channel data of used and unused broadcast waves allocated to each area and channel determining means responsive to the sensed position of the moving body for referring to the unused wave data memory and for determining a channel to be used for sound signal transmission from unused channel data, the broadcast wave receiving means wirelessly transmits sound signals which constitute the received TV broadcast waves to the radio set through an unused channel determined by the transmitting means.

It is further preferable that the broadcast wave receiver for a moving body includes means for sensing the sensitivity to reception of the reception channel in the broadcast wave receiving means and wherein the channel map data includes the data of channels for a given receivable broadcast station in an area where broadcast reception of the broadcast station is unstable, the channel determining means reads the data of receivable channels from the broadcast station data memory and to cause the broadcast wave receiving means to receive broadcast waves through the channels so that a reception channel having the highest reception sensitivity is automatically set as an optimum reception channel, when a sensed position of the moving body is in the unstable reception area of a selected broadcast station.

According to the present invention, the channel map data may include the data of receivable channels in the area of a given broadcast station where the broadcast reception is unstable. With the NHK TV broadcast station, for example, the broadcast station data memory stores the data of the first and eighth channels as receivable channels in the unstable reception area near the boundary between the first and eighth channel reception areas.

The channel determining means reads the data of reception channels from the broadcast station data memory as the moving body enters the area of a selected broadcast station where the broadcast reception is unstable. The channel determining means then causes the broadcast wave receiving system to receive the broadcast waves through the channels, so that a reception channel having the highest reception sensitivity will be automatically set as an optimum reception channel. Therefore, even when the moving body is in the unstable reception area of the selected broadcast station, it is possible to receive the broadcast waves by the broadcast wave receiver through the reception channel having the highest reception sensitivity in that area.

For example, when the vehicle enters an unstable reception area to which the first and eighth reception channels of the NHK TV broadcast are allocated, the channel determining means compares the first and eighth channels' sensitivity to broadcast reception and automatically sets the channel having higher sensitivity as an optimum reception channel. Thus, it is possible to receive the NHK TV broadcast at all times with the channel of high reception sensitivity, even when the moving body is in an area where the broadcast reception sensitivity of the first and eighth channels vary constantly.

Consequently, by using the data of the sensed position of a moving body for frequency switching, the present invention can provide a broadcast wave receiver for a moving body, in which the broadcast waves from a selected broadcast station can be received with extremely high reception sensitivity even in an unstable reception area.

The broadcast wave receiver for a moving body of the present invention may comprise means for sensing sensitivity to reception of the reception channel in the broadcast wave receiving means and wherein the channel determining means judges that a moving body is in an area of a selected broadcast station where the broadcast reception is unstable when reception sensitivity sensed by the reception sensitivity sensing means becomes equal to or lower than a predetermined reference level, reads data of receivable channels allocated to the selected broadcast station at the unstable reception area from the broadcast station data memory based on a sensed position of the moving body, and causes the broadcast wave receiving means to receive broadcast waves through the channels so that a reception channel having the highest reception sensitivity is automatically set as an optimum reception channel.

According to the present invention, the channel determining means may determine that the moving body is in an area of the selected broadcast station where the broadcast reception is unstable, when the reception sensitivity is equal to or lower than the predetermined reference level. The channel determining means may then read the data of receivable channels allocated to the selected broadcast station at the unstable reception area from the broadcast station data memory based on the sensed position of the moving body, and cause the broadcast wave receiving system to receive broadcast waves through these channels so that the reception channel having the highest reception sensitivity will be automatically set as an optimum reception channel.

In such a manner, the present invention can use the sensed position of a moving body for frequency switching so as to provide a broadcast wave receiver for moving body, in which the broadcast waves from the selected broadcast station can be received with extremely high sensitivity even when the moving body is in an unstable reception area.

The broadcast wave receiver for a moving body of the present invention may comprise means for sensing sensitivity to reception of the reception channel in the broadcast wave receiving means and wherein the channel map data includes the data of receivable channels of a given broadcast station for each area, and the channel determining means is responsive to a sensed position of a moving body for reading data of receivable channels of a selected broadcast station from the broadcast station data memory and for causing the broadcast wave receiving means to receive broadcast waves through the channels so that a reception channel having the highest reception sensitivity is automatically set as an optimum reception channel.

More particularly, the data of plural channels (e.g. the first and eighth channels) of a given receivable broadcast station (e.g. the NHK TV broadcast) for each area have been stored as channel map data. Base on the sensed position of a moving body, the reception channel is automatically switched to a channel with higher reception sensitivity. Thus, the broadcast wave receiver for moving body can receive the broadcast waves from the selected broadcast station with extremely high reception sensitivity even at an unstable reception area.

It is preferable that the broadcast wave receiver for a moving body of the present invention comprises an unused wave data memory which stores channel data of used and unused broadcast waves allocated to each area, channel determining means responsive to the sensed position of the moving body for referring to the unused wave data memory and for determining a channel to be used for sound signal transmission from unused channel data, a radio set mounted on the moving body and transmitting means for wirelessly transmitting sound signals which constitute the received broadcast waves through the determined unused channel and for outputting the sound signals as sounds from the sound generating portion of the radio set.

It is known a receiving system for on-vehicle TV set in which sound signals constituting the received broadcast waves are transmitted through a transmitter called "FM transmitter" toward audio speakers which in turn output the sound signals.

If a channel with the same frequency as the broadcast waves received at the current position of the moving body is used for wire transmission, the sound and image signals will interfere with each other.

According to the present invention, the channel data of used and unused broadcast waves are stored for each area. Based on the sensed position of the moving body, a channel to be used for the wireless transmission in the transmitter is then allocated to an unused channel at that area.

Thus, according to the present invention, it is possible to use information relating to the sensed position of the moving body to allocate automatically a channel to be used for wireless transmission of sound signals to a non-interference channel at the area. Therefore, the broadcast wave receiver can carry out effective wireless transmission from the broadcast wave receiving means to the on-vehicle radio set.

It is further preferable that the broadcast wave receiver for a moving body of the present invention comprises planned route input means for inputting a planned route which a moving body is to take, channel determining means responsive to an inputted planned route for referring to unused channel data in the unused wave data memory and for determining a channel to be used for sound signal transmission along the planned route from the unused channel data and storing a determined channel in a memory, and channel switching means responsive to the sensed position of the moving body for referring to the data stored in the memory and for switching a channel in the transmitting means being used for sound signal transmission.

When a planned route which the moving body is to take is inputted in the broadcast wave receiver through the planned route input means, the channel determining means automatically determines the unused channel to be used along the planned route.

By having previously inputted the planned route into the broadcast wave receiver in such a manner, the wireless transmission from the broadcast wave receiving means to the on-vehicle radio set can be carried out effectively without interference with the broadcast waves from the broadcast station.

The system of the present invention can be more simplified in structure, when the position sensor of a navigation system is used as a moving body position sensor.

BRIEF DESCRIPTION OF THE DRAWINGS

FIGS. 1A and 1B are a block diagram of a first preferred embodiment of a system constructed in accordance with the present invention;

FIGS. 8A and 8B are a block diagram of a second preferred embodiment of a system constructed in accordance with the present invention;

BEST FORMS FOR CARRYING OUT THE INVENTION

Some preferred embodiments of the present invention will be described with reference to the drawings.

First Embodiment

Figure 1B:
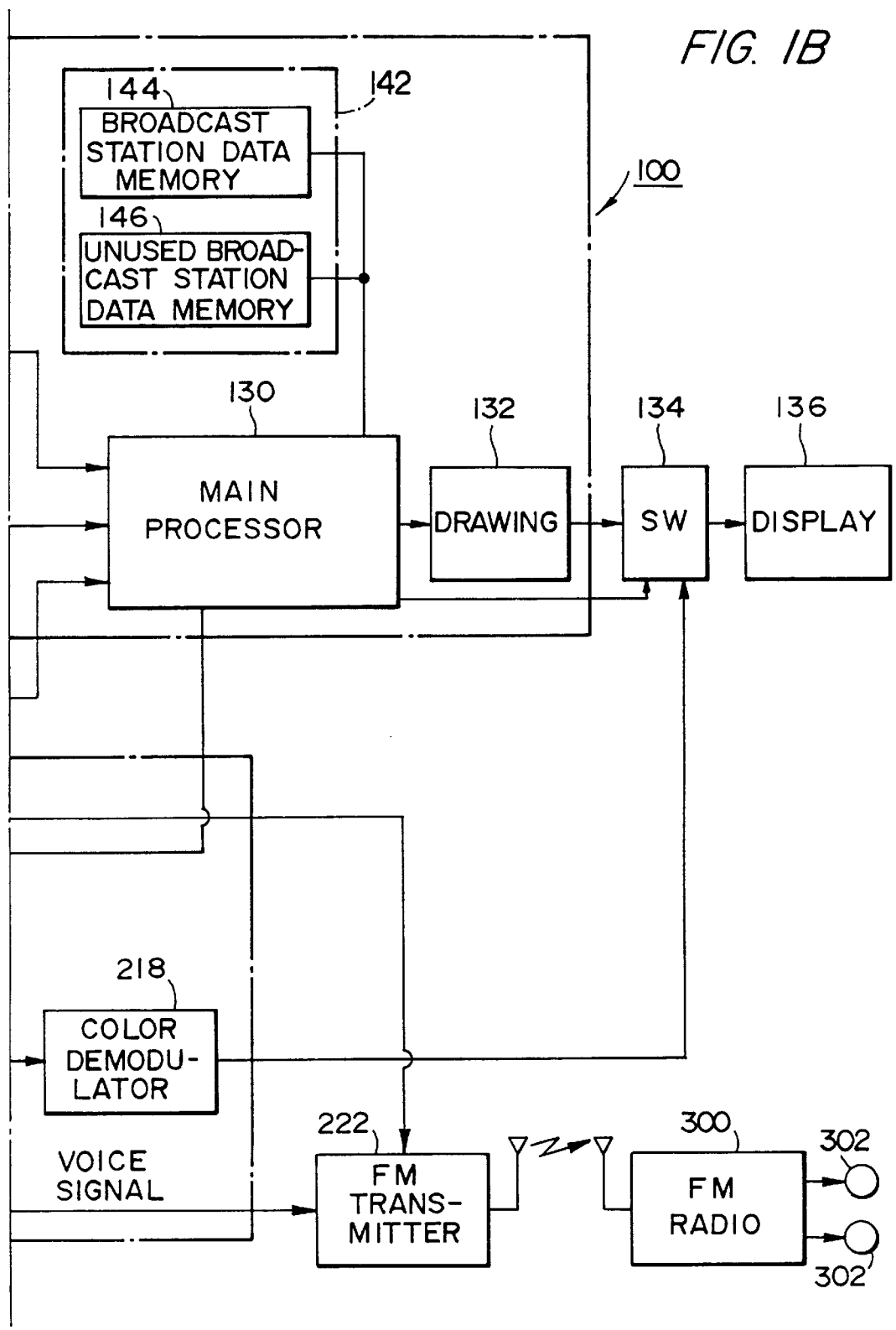

FIGS. 1A and 1B show the first preferred embodiment of the present invention.

The apparatus according to the first embodiment comprises an on-vehicle navigation system 100 and a broadcast wave receiving system 200.

The navigation system 100 is started by a start command from an operator through an operator console 110.

The navigation system 100 utilizes radio waves from GPS satellites to know its own current position. More particularly, the radio waves from at least three among 24 GPS satellites now orbiting around the earth are received by a GPS antenna 112, and then inputted into a back-diffusion demodulator 116 through a tuner 114. Since the radio waves are transmitted from the GPS satellites through a frequency spectrum diffusion system, signals from the tuner 114 are back-diffusion demodulated by the back-diffusion demodulator 116, and then inputted into a coordinate computing unit 118. The coordinate computing unit 118 is responsive to the received data from at least three GPS satellites for computing the current position of a vehicle on which the navigation system is mounted as three-dimensional coordinate data X, Y and Z which are in turn outputted therefrom toward a main processing circuit 130. It is assumed herein that X is the longitude, Y is the latitude, and Z is the height.

CDROM 122 in which data such as map data have been written is detachably mounted in a ROM drive circuit 120. The main processing circuit 130 is responsive to the sensed current position of the vehicle, so as to output a read command for the map data around the vehicle's current position to the ROM drive circuit 120. The ROM drive circuit 120 then reads the map data of the specified area from the CDROM 122, the map data being then outputted to the main processing circuit 130.

The main processing circuit 130 combines the inputted map data with elements such as the vehicles' current position and the direction of movement. The combined data is then converted into image signals through a drawing circuit 132, the image signals being then shown on a display 136 through a switch 134 as a navigation image.

The driver can see the navigation image shown on the display 136 representing the vehicle's position and the direction in which the vehicle is moving on the map, and know precisely where he is and in which direction he is directed toward in real time.

The broadcast wave receiving system 200 is started by receiving broadcast waves from a TV broadcast station, when the operator inputs a start command into the broadcast wave receiving system through the operator console 110.

More particularly, when the operator switches on the TV broadcast wave receiving system 200, and selects a desired channel, the signals are inputted into the main processing circuit 130. The main processing circuit 130 then shifts the switch 134 from the navigation system 100 side to the broadcast wave receiving system 200 side. At the same time, the main processing circuit 130 outputs a selection command for the selected broadcast station toward a TV computing circuit 220 to control the tuner 214.

Signals received by the TV antenna 210 are inputted into the tuner 214 through a diversity controller 212, wherein the channel signals set by the TV computing circuit 220 are detected and outputted through an IF amplifying circuit 216. TV image signals from the IF amplifying circuit 216 are fed to a color amplifying circuit 218 which is then outputted as RGB color image signals, the color image being shown on the display 136 through the switch 134.

TV sound signals outputted from the IF amplifying circuit 216 are then fed to an on-vehicle FM radio set 300 by an FM transmitter 222 through FM waves associated with a desired channel. The sound signals are reproduced and outputted from respective left and right speakers 302.

In such a manner, the broadcast wave receiving system 200 can receive broadcast waves from any selected TV broadcast station and show TV images on the display 136 while outputting TV sounds from the on-vehicle audio speakers 302 with higher quality.

In this embodiment, the broadcast wave receiving system 200 includes a plurality of antennas 210 and a diversity controller 212 which can selectively direct signals received by one of the antennas 210 having higher sensitivity toward the tuner 214. More particularly, the TV computing circuit 220 is responsive to the signals from the IF amplifying circuit 216 for sensing one of the two antennas 210 with higher sensitivity. The diversity controller 212 then selects and outputs the signals received by the antenna with higher sensitivity. Such a control is repeated at given intervals. In such a manner, the broadcast waves can be received with improved sensitivity using a plurality of antennas.

The general arrangement of the navigation and broadcast wave receiving systems 100, 200 has been described.

The first embodiment of the present invention is characterized by that the navigation data obtained by the navigation system 100 are effectively used as data for receiving broadcast waves through the broadcast wave receiving system 200. Therefore, a driver driving through an unfamiliar area can simply determine a receiving channel. In addition, the determined receiving channel can be automatically controlled to secure the desired reception at all times, on the basis of the sensed position and selected broadcast station data. station data.

The navigation system 100 further comprises a data memory 142 that has stored the broadcast station data in connection with area data. The data memory 142 comprises a broadcast station data memory 144 and an unused broadcast station data memory 146.

Receivable Broadcast Station Data

The broadcast station data memory 144 has previously stored the channel data of receivable broadcast stations for each geographical area.

Figure 2:
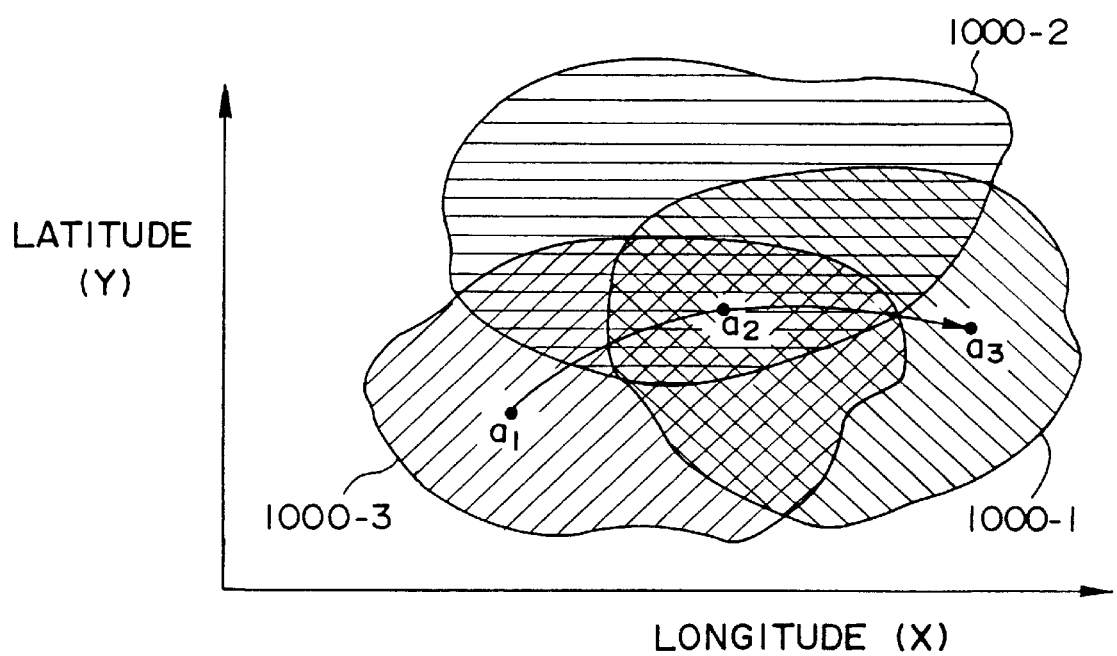
FIG. 2 is a graph illustrating reception areas for broadcast stations.

FIG. 2 shows an example of thus stored channel data. In this figure, the horizontal axis represents the longitude while the vertical axis represents the latitude. Further, 1000-1 shows an area at which the broadcast waves from a broadcast station allocated to channel 1 can be received; 1000-2 shows an area at which the broadcast waves from a broadcast station allocated to channel 6 can be received; and 1000-3 shows an area at which the broadcast waves from a broadcast station allocated to channel 9 can be received.

When the operator inputs a search command into the navigation system via the operator console 110, the main processing circuit 130 is initiated as a broadcast station data searching means.

Figure 3:
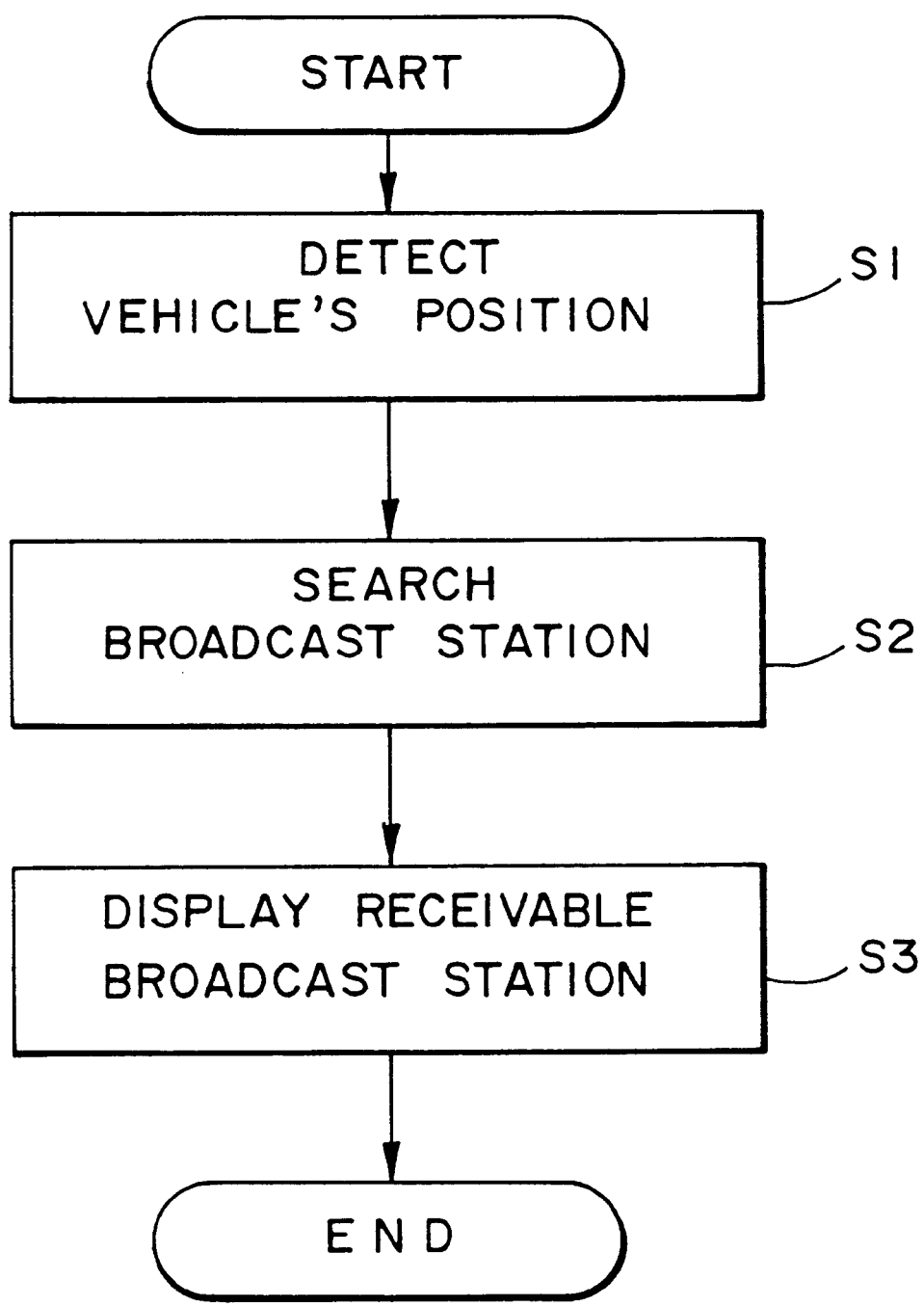
FIG. 3 is a flowchart illustrating an operation of the system.

FIG. 3 shows a flowchart illustrating the operation of the main processing circuit 130, when it functions as the broadcast station data searching means.

As the search is initiated, the main processing circuit 130 reads the current position of the vehicle sensed by the coordinate computing unit 118 (step S1). The main processing position in order to search the channel data of receivable broadcast stations at the sensed position (step S2). The result of search is reported to the operator (step S3). In the first embodiment, the channel data of the searched receivable broadcast stations is shown on the display 136 as images through the drawing circuit 132 and switch 134.

Thus, the operator or driver can visually see the receivable broadcast stations at the current position of his or her vehicle in real time.

It is now assumed that the vehicle moves from a point a1 through a2 to a3 on the X-Y coordinates of FIG. 2. When the current position of the vehicle sensed by the coordinate computing unit 118 is on the point al, the broadcast station allocated to channel 9 is shown on the display 136 as a receivable broadcast station. When the sensed position is on the point a2, all three broadcast stations allocated to channels 1, 6 and 9 are shown on the display 136 as receivable broadcast stations. When the sensed position is on the point a3, only the broadcast station allocated to channel 1 is shown on the display 136 as a receivable broadcast station.

If necessary, the channel data of the receivable broadcast station(s) may be outputted by sounds through the speakers of an on-vehicle radio set or the like.

In such a manner, the operator can know of a receivable broadcast station at an area in which the vehicle is moving in real time, simply by inputting a search command into the broadcast wave receiving system through the operator console 110 even if he or she may be unfamiliar with the area. The broadcast wave receiving system requires the operator to manipulate the operator console 110 in order to select any desired channel from a plurality of channels shown by the display.

The channel selection may be more convenient if the display 136 shows any supplementary data associated with a displayed channel; for instance, the name of a broadcast station allocated to the displayed channel if that broadcast station is a local affiliate to the key broadcast station.

Channel Data of the Same or Affiliated Broadcast Station

In addition, the broadcast station data memory 144 stores the channel data of the same or affiliated broadcast stations allocated to the respective areas as channel map data for each broadcast station.

Figure 4:
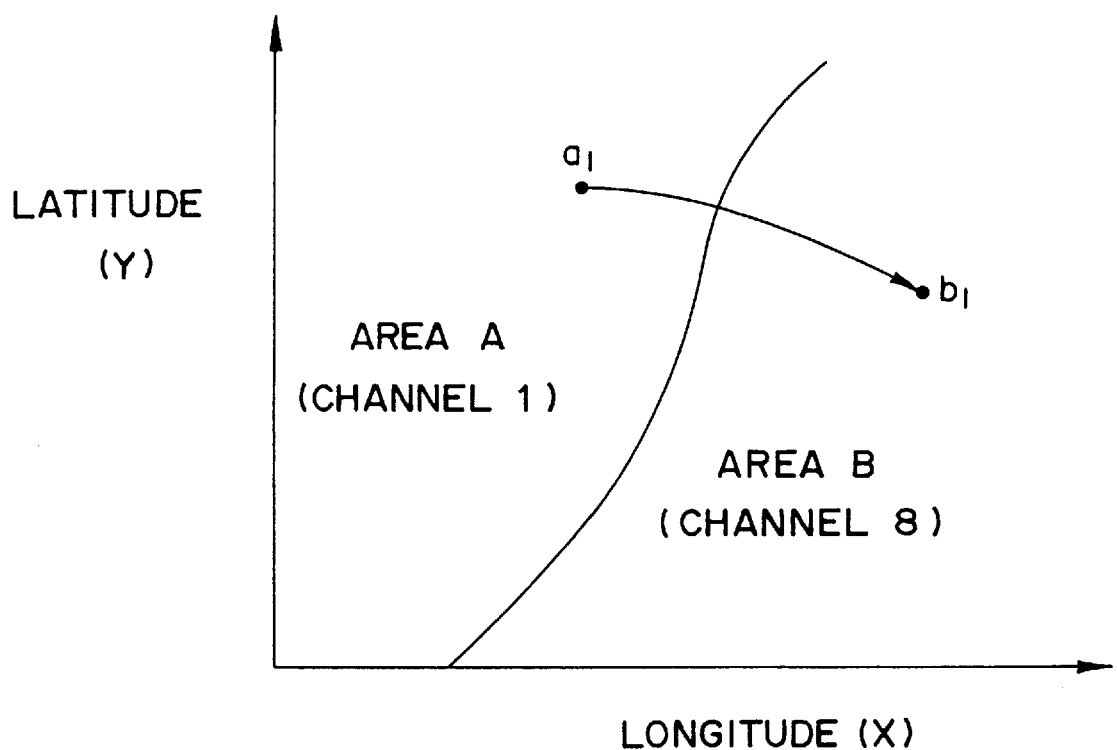
FIG. 4 is a graph illustrating the channel map data for channels allocated to a broadcast station for each area.

FIG. 4 shows an example of channel data of the NHK TV broadcast allocated to receivable areas. As shown, the NHK TV broadcast is allocated to channel 1 or 8 for each receivable area. Such channel map data has been stored in the memory 144.

If a receivable area of a local broadcast station is divided into sections by mountains or the like, different channels may be allocated to the respective sections. In such a case, the broadcast station data memory may store the reception channel data allocated to the respective sections as the channel map data of that local broadcast station.

Frequently, key Tokyo-based broadcast stations such as Tokyo Broadcast Station (TBS), Fuji Television (Fuji TV), and the local affiliates simultaneously broadcast the same programs. Thus, the channel map data for channels of key Tokyo-based stations and channels of their local affiliates allocated to broadcast receivable areas, is formed for respective local affiliates broadcast stations. For example, the channel map data of local affiliates to TBS or Fuji TV is formed. The channel map data is stored in the memory 144.

When the operator manipulates the operator console 110 to set the automatic channel switching function and to input a selection command for the desired broadcast station, the main processing circuit 130 functions as channel determining means.

The main processing circuit 130 is responsive to the sensed position inputted from the coordinate computing unit 118 as well as the selection command from the operator console 110 for referring to the broadcast station data memory 144 and for determining the reception channel of the selected broadcast station at the sensed position. Thus, the reception channel is automatically set in the tuner 214 through the TV computing circuit 220.

Figure 5:
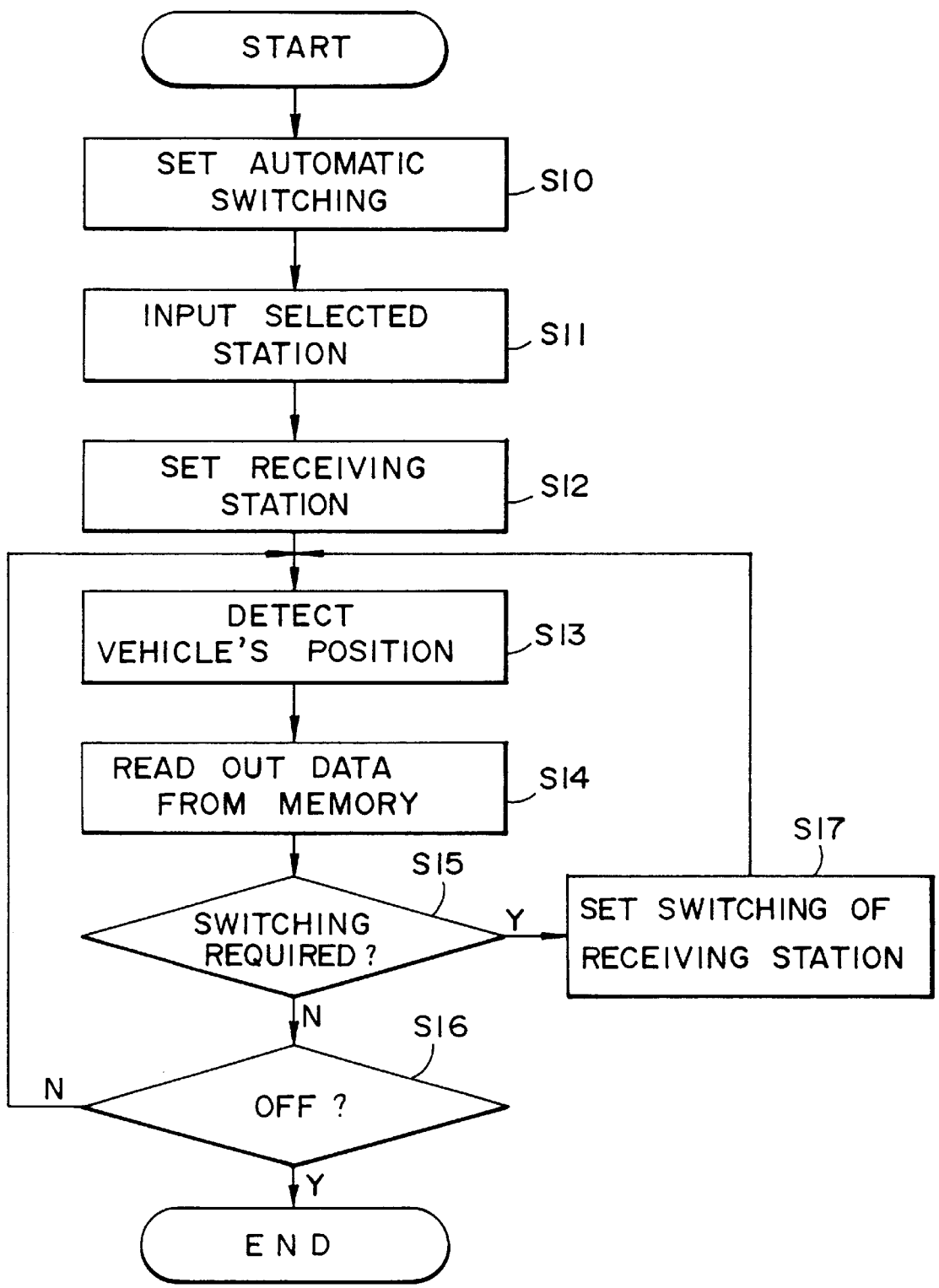
FIG. 5 is a flowchart illustrating another operation of the system.

FIG. 5 shows the operation of the main processing circuit 130 at this point.

It is now assumed that when the vehicle is at the point a1 of FIG. 4, the operator inputs an automatic switching function setting signal and a selection command for selecting, for example, channel 1 of the NHK TV broadcast via the operator console 110 (steps S10 and S11).

The main processing circuit 130 sets the reception channel of the tuner 214 to the channel 1 via TV computing circuit 220 (step S12). Thus, the TV broadcast waves of the channel 1 received by the antennas 210 are shown by the display 136 as TV color images. At the same time, the TV sound signals contained therein are wirelessly transmitted to the FM radio set 300 through the FM transmitter 222, the transmitted sound signals being then reproduced by the radio set 300 and outputted from the left and right stereo speakers 302.

After that, based on the current position of the vehicle sensed by the coordinate computing unit 118, the main processing circuit 130 reads a reception channel for the NHK broadcast at the vehicle position from the broadcast station data memory 144 (steps S13 and S14), and then judges whether or not the reception channel should be switched to another channel (step S15). Such a series of steps will be repeated.

If the vehicle is in area A, the main processing circuit 130 judges that switching of channel is not required. The procedure returns from step S16 to step S13. Such a series of steps S13 to S15 will be repeated.

As the vehicle moves from area A to area B, the main processing circuit 130 judges that the reception channel of the NHK TV broadcast should be switched from the channel 1 to channel 8 (steps S13, S14 and S15), based on the vehicle position sensed by the coordinate computing unit 118, and switches the reception channel of the tuner 214 to the channel 8 via the TV computing circuit 220 (step S17).

In such a manner, it is possible to receive TV broadcasts while ensuring good reception, by automatically switching the channel of a set broadcast station to an optimum channel allocated to each geographical area based on the current vehicle position.

Once a broadcast station such as the NHK TV broadcast station is selected, even a user unfamiliar with the local area may enjoy a broadcast without troublesome channel selection, since the reception channel of the broadcast station is automatically switched to an optimum reception channel associated with the vehicle position sensed by the navigation system 100.

As described, the broadcast station data memory 144 of the first embodiment stores the channel map data of other broadcast stations besides the NHK TV broadcast, as shown in FIG. 4.

If the channel of a key broadcast station is selected in the same manner as described, the main processing circuit 130 is responsive to the current vehicle position sensed by the coordinate computing unit 118 for automatically setting the reception channel of the tuner 214 to a channel for the key or affiliated broadcast station. Thus, the user can enjoy a TV program with excellent reception without troublesome channel selection.

If the automatic switching mode is released in the operator console 110, the main processing circuit 130 causes the tuner 214 to select only the selected channel regardless of the vehicle position.

Channel Switching of FM Transmitter

In the system of the first embodiment, the unused broadcast station data memory 146 stores the data of an unused FM channel for each geographical area. A plurality of FM broadcast stations exist throughout Japan. The range of wave reception for each FM broadcast station has been known. Therefore, the memory 146 stores the data of a not-received FM channel for each area.

The main processing circuit 130 functions as used channel determining means.

Figure 6:
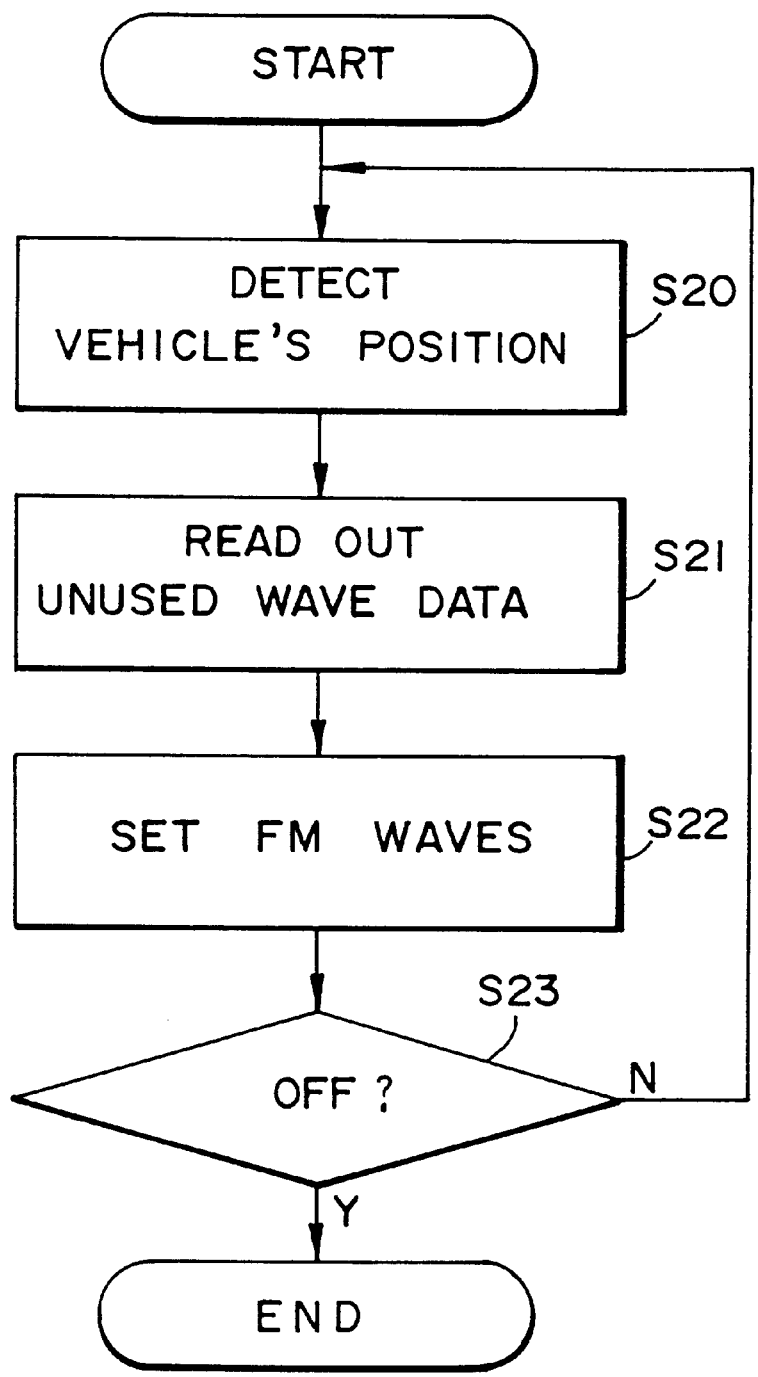
FIG. 6 is a flowchart illustrating a further operation of the system.

FIG. 6 shows a flowchart of the main processing circuit 130 when it functions as used channel determining means.

The main processing circuit 130 is responsive to the vehicle position sensed by the coordinate computing unit 118 for referring to the memory 146 to sense unused channels at the sensed vehicle position (steps S20 and S21). Any channel among the sensed unused channels is determined as a channel for FM transmitter. The transmission frequency of the TV transmitter 222 is automatically adjusted to the frequency of the determined FM channel (step S22), via the TV computing circuit 220.

Such a series of steps is repeated until the broadcast wave receiving system 200 is turned off. At this point, the procedure will terminate (step S23).

Thus, the FM waves transmitted from the FM transmitter 220 to the FM radio set 300 will not interfere with the broadcasts of a local FM broadcast station. Therefore, sounds can be outputted pleasantly from the speakers 302 at all times.

Figure 7:
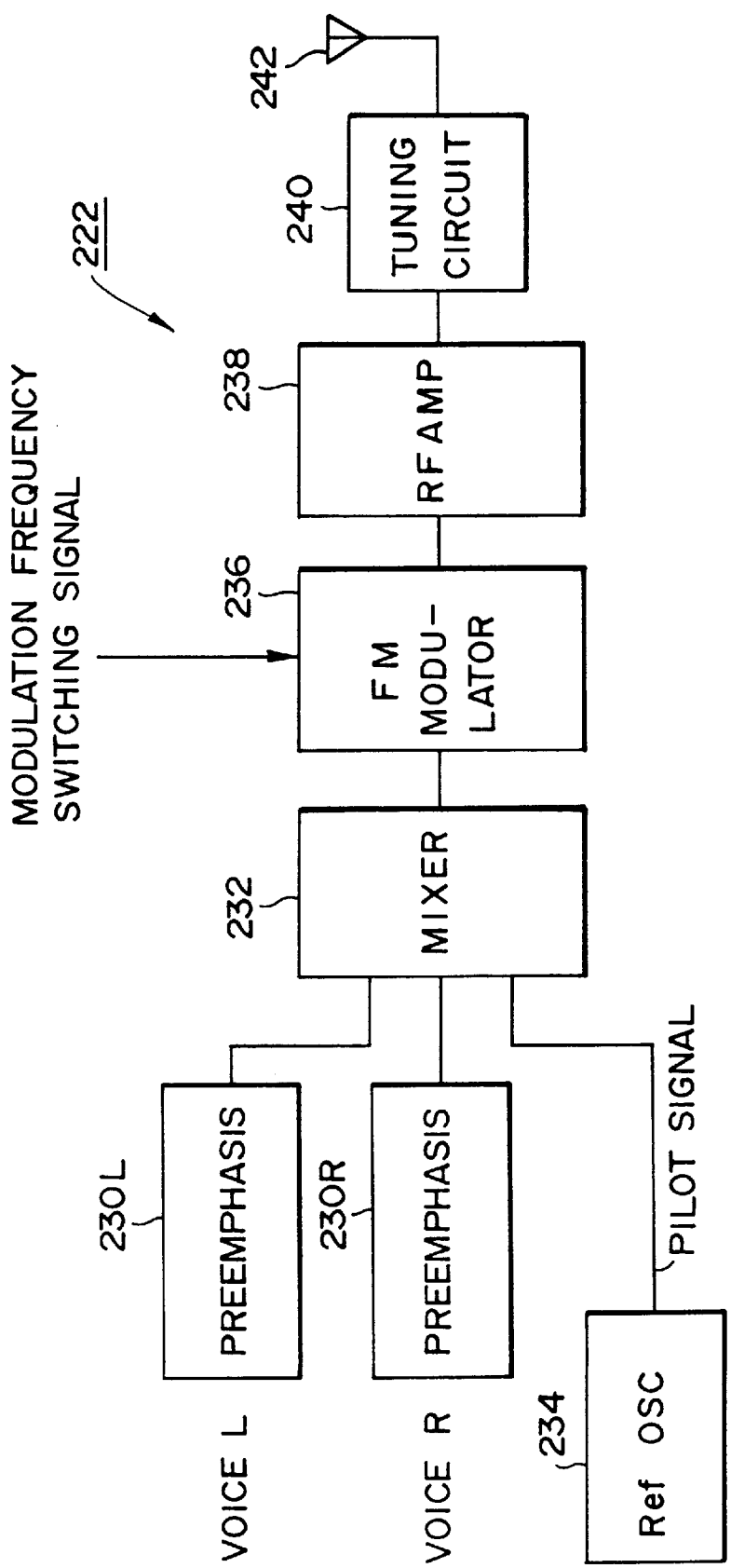
FIG. 7 is a block diagram illustrating a FM transmitter in the system of FIG. 1.

FIG. 7 shows the details of the FM transmitter 222.

The FM transmitter 222 of the first embodiment includes preemphasis circuits 230L and 230R for amplifying sound signals of two left and right channels outputted from an FM demodulation circuit 216. The amplified sound signals are mixed with pilot signals from a reference oscillator 234 at a mixer 232 and then inputted into an FM modulator 236.

The FM modulator 236 has its modulation frequency automatically set at the frequency of an FM channel that is determined by the main processing circuit 130 according to the flowchart shown in FIG. 6. The FM modulator 236 uses the set modulation frequency to subject the input signals from the mixer 232 to FM modulation. The modulated sound signals are then transmitted from an antenna 242 to the FM radio set 300 through RF amplifier 238 and tuning circuit 240.

Second Embodiment

The second preferred embodiment of the present invention will now be described.

In the system of the first embodiment, the channel map data stored in the broadcast station data memory 144 contains one channel set for one area, as shown in FIG. 4. With the NHK TV broadcast, for example, the channels 1 and 8 are set for the areas A and B, respectively.

The setting of channel map data will not raise any problem unless the reception sensitivity falls near the area boundary. In some circumstances, however, reception may be unstable near the area boundary.

Figure 9:
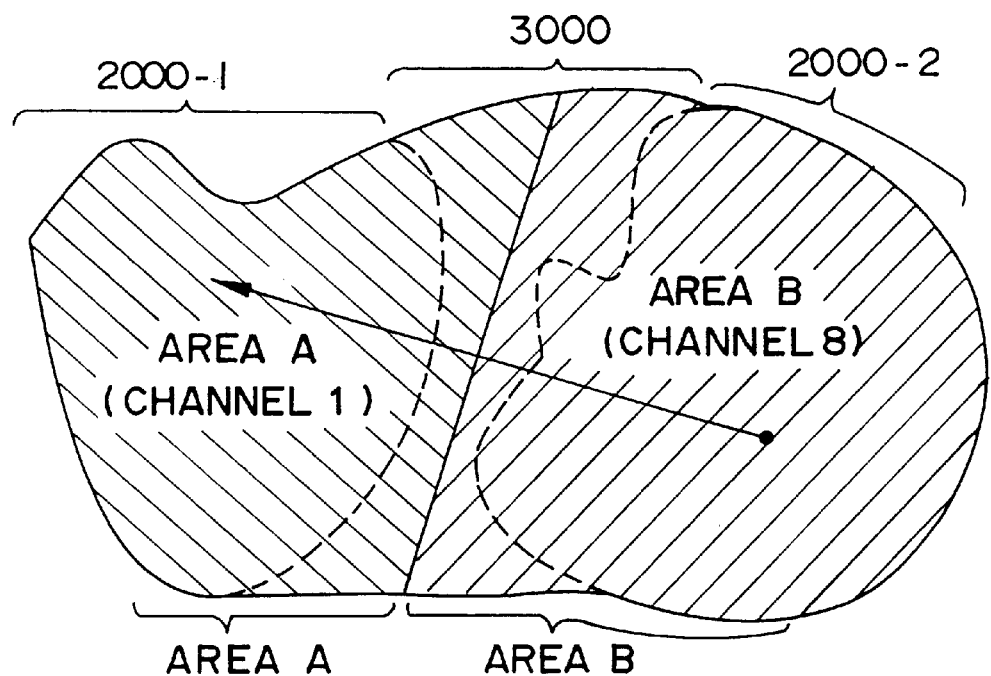
FIG. 9 illustrates the channel map data in the second preferred embodiment.

FIG. 9 shows such a case. It is now assumed that the channel of the NHK TV broadcast is set at the channel 1 in the area A and at the channel 8 in the area B. It is also assumed that mountains disturbing the broadcast reception exist at the boundary 3000 between these areas at which the broadcast reception is unstable.

In such a case, the area A includes an area 2000-1 where the broadcast reception of the channel 1 is excellent and the unstable reception area 3000. Similarly, the area B includes an area 2000-2 where the broadcast reception of the channel 8 is excellent and the unstable reception area 3000.

When the vehicle is moving in the unstable reception area 3000 of the area B, the broadcast reception of the channel 1 is often pleasant, even if that of the channel 8 is radically degraded. Similarly, when the vehicle is moving in the unstable reception area 3000 of the area A, the broadcast reception of the channel 8 is often excellent, even if that of the channel 1 is radically degraded.

In the system of the first embodiment, the good reception is not necessarily obtained, when the vehicle is moving in the unstable reception areas 3000.

To overcome such a problem, the system of the second embodiment provides channel map data stored in the memory 144, the channel map data including the data of a plurality of channels for the same or affiliated broadcast station, the broadcasts of which can be received at the unstable reception areas 3000 as shown in FIG. 9 (channels 1 and 8).

In other words, the channel map data of each broadcast station stored in the memory 144 includes the data of a plurality of channels for a broadcast station, the broadcast waves of which can be received at the unstable reception areas 3000.

If the vehicle receiving the NHK TV broadcast moves from the areas B to A as shown in FIG. 9, the reception channel is set at the channel 8 in the area 2000-2. When the vehicle is moving in the unstable reception area 3000, the reception of the channels 1 and 8 are compared and one of which having better reception is selected. When the vehicle is moving in the area 2000-1, the reception channel is set at the channel 1.

Thus, it is possible to obtain good reception sensitivity, even when the vehicle is moving in the unstable reception area 3000.

Figure 8B:
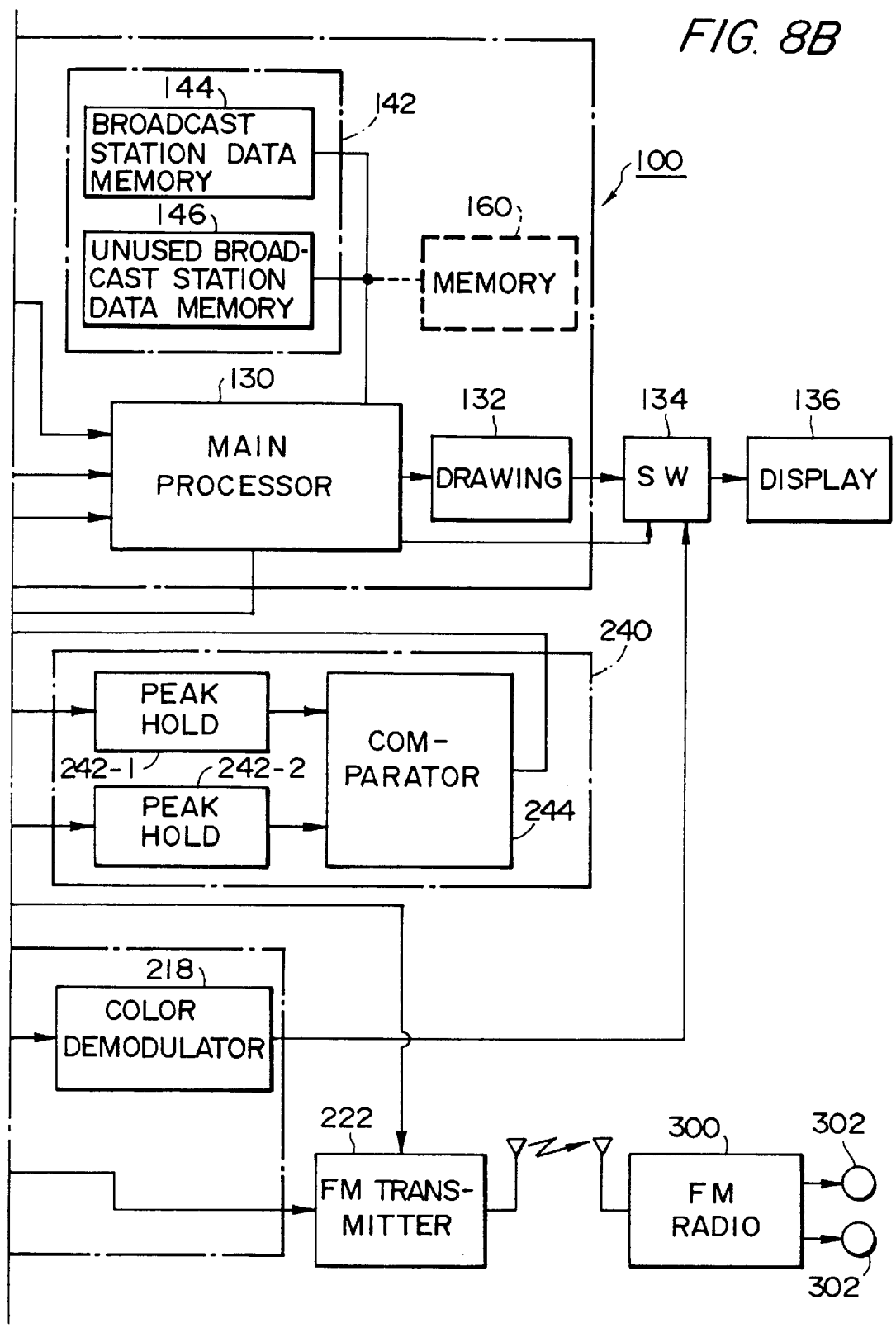

FIGS. 8A and 8B show a circuit in the system of the second embodiment which constitutes such an arrangement.

The broadcast station data memory 144 stores the channel map data including the data of a plurality of channels for each broadcast station, the broadcasts of which can be received at the unstable reception areas. For example, the channel map data of the NHK TV broadcast may include the reception area 2000-1 set for the channel 1, the reception area 2000-2 set for the channel 8 and the unstable reception area 3000 sandwiched between these two reception areas, as shown in FIG. 9. Further, the data of the channels 1 and 8 is set as receivable channels for the unstable reception area 3000.

The broadcast wave receiving system 200 comprises two tuners 214-1 and 214-2 as well as two associated IF demodulation circuits 216-1 and 216-2. The outputs of the IF demodulation circuits 216-1 and 216-2 are selectively outputted through a switch 224, the image signals thereof being inputted into a color demodulation circuit 218. The sound signals in the outputs of the IF demodulation circuits are inputted into the FM transmitter 222.

The video outputs of the IF demodulation circuits 216-1 and 216-2 are inputted into a reception sensitivity sensing circuit 240.

The reception sensitivity sensing circuit 240 comprises two peak hold circuits 242-1 and 242-2 each for holding a peak value in the video signals for one frame outputted from the corresponding one of the IF demodulation circuits 216-1 and 216-2 and a comparator 244 for comparing the hold values of the peak hold circuits 242-1 and 242-2 and for outputting the detection signals of one of the IF demodulation circuits having a higher peak hold value toward the TV computing circuit 220. More particularly, the reception sensitivity sensing circuit 240 compares the sensitivity of signals received by the tuners 214-1 and 214-2 for one frame, and to sense one of the tuners having higher sensitivity of reception, the detection signal being then outputted therefrom toward the TV computing circuit 220.

As a selection command for a broadcast station is inputted into the broadcast wave receiving system through the operator console 110, the main processing circuit 130 refers to the channel map data of that broadcast station stored in the broadcast station data memory 144, based on the current vehicle position inputted from the coordinate computing unit 118. The data of the channel receivable at the vehicle position will be outputted from the main processing circuit 130 toward the TV computing circuit 220.

The TV computing circuit 220 is responsive to the channel data thus inputted for setting the reception channels of the tuners 214-1 and 214-2.

With the NHK TV broadcast, for example, the data of the channel 8 is fed from the main processing circuit 130 to the TV computing circuit 220, when the vehicle is moving in the area 2000-2. Thus, the TV computing circuit 220 sets the reception channel of the tuner 241-1 at the channel 8, and switches the switch 224 to select and output the output of the IF demodulation circuit 216-1.

When the vehicle is moving in the unstable reception area 3000, the data of the channels 1 and 8 are supplied from the main processing circuit 130 to the TV computing circuit 200. The TV computing circuit 220 then controls the tuners 214-1 and 214-2 to receive the broadcasts of the respective channels 1 and 8. The reception sensitivity sensing circuit 240 judges which of channel 1 and 8 has higher reception sensitivity for each frame, the detection signal being then outputted toward the TV computing circuit 220.

The TV computing circuit 220 controls the switch 224 to select and output the signals of a channel having higher reception sensitivity. If the channel 1 has higher reception sensitivity, the switch 224 is controlled to feed the output of the IF demodulation circuit 216-1 toward the color modulation circuit 218 and FM transmitter 222.

Thus, when the vehicle is moving in the unstable reception area 3000, the system of the second embodiment senses a channel having higher reception sensitivity. The optimum channel setting procedure in which a reception channel can be automatically set will be repeated. Therefore, even in the unstable reception area, the broadcasts of the selected broadcast station can be received with higher reception sensitivity.

Modifications

The second embodiment is described in terms of the channel map data stored in the memory 144 as shown in FIG. 9. However, it is possible to obtain good reception in the unstable reception area 3000 by using the following technique, in spite of using the other channel map data excluding such unstable reception area 3000 as shown in FIG. 4.

For instance, it is assumed that when the vehicle is moving in the area B of FIG. 9, the tuner 214-1 is set at the channel 8 for receiving the NHK TV broadcast. In such a case, the switch 224 is controlled to select the output of the IF demodulation circuit 216-1.

The reception sensitivity sensing circuit 240 judges whether or not the reception sensitivity of the tuner 214-1 is reduced to a level equal to or lower than a reference level. In this case, the reception sensitivity sensing circuit 240 judges the reception sensitivity of the channel 8 when the vehicle is moving the area B. Judgement is then fed back to the main processing circuit 130.

When the reception sensitivity of the channel 8 is reduced to a level equal to or lower than the reference level, the main processing circuit 130 judges that the vehicle enters the unstable reception area 3000 shown in FIG. 9.

The main processing circuit 130 then searches the area A adjacent the area B from the data in the memory 144, based on the current vehicle position. In addition to the data of the reception channel 8 at the area B where the vehicle is, the main processing circuit 130 outputs the data of the reception channel 1 at the adjacent area A to the TV computing circuit 220.

The TV computing circuit 220 is responsive to the data from the main processing circuit 130 for setting the reception channels of the tuners 214-1 and 214-2 at the channels 1 and 8, as in the second embodiment. The switch 224 is controlled to output the data received through one of the channels with higher sensitivity.

As in the second embodiment, it is possible to receive the broadcast waves with good reception sensitivity even in the unstable reception area.

Besides, desired reception sensitivity may be obtained by other means such as the following technique.

Figure 10:
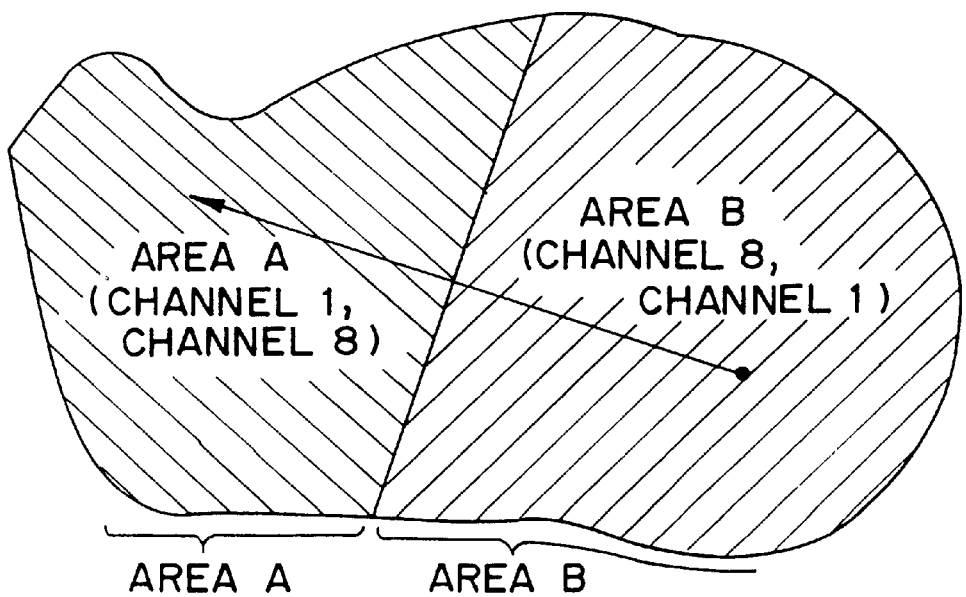
FIG. 10 illustrates the channel map data in a further preferred embodiment of the present invention.

The channel data of the same or affiliated broadcast station allocated to each area has been stored in the broadcast station data memory 144 as channel map data. As shown in FIG. 10, for example, the channels of the NHK TV broadcast are set to the channel 1 at the area A and to the channel 8 at the area B. In addition, a receivable channel other than the set channel may be also set for each set area relating to the broadcast station. It is assumed herein that the channels 8 and 1 are set to the areas A and B as receivable NHK TV broadcast channels, respectively.

In such a manner, the data of a plurality of receivable channels have been stored in the memory 144 for each area as the channel map data of the NHK TV broadcast.

The main processing circuit 130 which functions as channel determining means, may set the tuners 214-1 and 214-2 to the respective channels 8 and 1 for receiving the NHK TV broadcast, when the vehicle is in the area B shown in FIG. 10. It is assumed herein that the switch 224 is located to select the output of the IF demodulation circuit 216-1.

For each frame the reception sensitivity sensing circuit 240 detects which of the IF demodulation circuits 216-1 and 216-2 has higher reception sensitivity, and outputs the detection signal toward the TV computing circuit 220.

The TV computing circuit 220 controls the switch 224 to select and output the signals of one of the channels having higher reception sensitivity. Thus, the broadcast waves can be received with the good reception sensitivity even in the unstable reception area.

The second embodiment and its modifications have been described in terms of two sets of tuners and IF demodulation circuits, a set of tuner and IF demodulation circuit may be used through a time sharing manner to provide similar advantages. For example, when the vehicle is in the unstable reception area 3000, the tuner 214 is switched to the channels 1 and 8 to receive signals through both the channels during blanking of the received TV signals. It is possible to receive signals for the next frame through one channel with a higher sensitivity. This can provide advantages similar to those of the second embodiment.

Other Embodiments

The present invention is not limited to the aforementioned embodiments, but may be carried out in any of various changed forms within the scope of the invention.

For example, the operator console 110 shown in FIG. 8A may be used as planned route input means which can previously input a planned route.

In such a case, the main processing circuit 130 functions as channel setting means. Unused channels are set for FM transmitter 222 and FM radio set 300 which would be used according to the planned route, and are stored in the memory 160. Based on the inputted planned route the main processing circuit 130 refers to the unused wave data memory 146, and sequentially sets unused channels to be used along the planned route. These unused channels are written into and stored in the memory 160 in connection with the planned route.

When the vehicle moves, the main processing circuit 130 is responsive to the sensed position inputted by the coordinate computing unit 118 for referring to the data of the memory 160, and for automatically setting the FM transmitter 222 and FM radio set 300.

Thus, it is possible to control the transmission/reception frequencies of the FM transmitter 222 more smoothly. In this embodiment, further, the reception frequency of the FM radio set 300 may be automatically switched from one to another at the same time as the FM transmitter 222.

All the aforementioned embodiments have been described as to vehicles. Nevertheless, the present invention is not limited to vehicles, but may be similarly applied to any of the other moving bodies such as a ship.

Furthermore, all the aforementioned embodiments have been described as to the reception of TV broadcast waves from TV broadcast stations. Nevertheless, the present invention is not limited to such forms, but may be applied to reception of broadcast waves from FM broadcast stations or the other various broadcast stations.

Finally, the embodiments have been described as to the use of the broadcast station data memory 144 and unused broadcast station data memory 146 fixedly mounted within the system. And yet, the present invention is not limited to such forms, but may applied to such memories detachably mounted within the system. In such a case, the data to be written in these memories 144 and 146 is stored in the CDROM 122 which is in turn used as part of each of the memories 144 and 146.

What is claimed is:

1. A broadcast station data detector for a moving body, comprising:

position sensing means for sensing a geographic position of the moving body;

a broadcast station data memory which stores channel map data of a receivable broadcast station for a broadcast area;

broadcast station data searching means for searching the channel map data in said broadcast station data memory based on the sensed geographic position of the moving body and outputting a receivable broadcast station prior to receiving any broadcast signal; and transmitting means for transmitting received broadcast signals to a radio set mounted on the moving body.

2. The broadcast station data detector according to claim 1, further comprising input means for inputting a search command, wherein said broadcast station data searching means responds to said search command by reporting said channel map date of the receivable broadcast station to a user.

3. The broadcast station data detector according to claim 1, wherein said broadcast station data searching means responds to said sensed geographic position of the moving body by searching the channel map data in said broadcast station data memory and by reporting a channel of said receivable broadcast station at the sensed geographic position to a user.

4. The broadcast station data detector according to claim 1, wherein the broadcast station data searching means reports said receivable broadcast station at said sensed geographic position to a user.

5. The broadcast station data detector according to claim 1, further comprising reporting means for reporting information to a user through at least one of images and sounds, wherein said broadcast station data searching means reports the channel map data of said receivable broadcast station to the user through said reporting means.

6. The broadcast station data detector according to claim 5, wherein said reporting means includes an image display means mounted on said moving body for showing said images of the channel map data of said receivable broadcast station.

7. The broadcast station data detector according to claim 5, wherein said reporting means includes a sound generating means mounted on said moving body to output sounds corresponding to the channel map data of said receivable broadcast station.

8. The broadcast station data detector according to claim 5, wherein said broadcast station data memory stores said channel map data of a receivable broadcast TV station for a TV broadcast area and said broadcast station data searching means responds to said sensed geographic position of the moving body by searching the channel map data of said broadcast station data memory and by reporting a channel of the receivable broadcast TV station at the sensed geographic position to the user.

9. A broadcast wave receiving system for a moving body having a broadcast station data detector, the broadcast station data detector comprising:
   position sensing means for sensing a geographic position of the moving body;
   a broadcast station data memory which stores channel map data of a receivable broadcast station for a broadcast area;
   broadcast station data searching means for searching the channel map data in said broadcast station data memory based on the sensed geographic position of the moving body and outputting receivable broadcast stations prior to receiving any broadcast signal; and
   transmitting means for transmitting received broadcast signals to a radio set mounted on the moving body.

10. A broadcast wave receiving system for a moving body, comprising:
    position sensing means for sensing a geographic position of the moving body;
    a broadcast station data memory which stores channel map data of at least one of a broadcast station and affiliates thereof allocated to a broadcast area for said broadcast station and affiliates thereof, respectively;
    selection input means for inputting a selection command for selecting a broadcast station from receivable broadcast stations and affiliates associated with the selected broadcast station determined prior to receiving any broadcast signal;
    channel determining means coupled to the position sensing means, the broadcast station data memory and the selection input means for searching the channel map data in said broadcast station data memory based on said sensed geographic position of the moving body and said selection command, and for determining a reception channel of a selected broadcast station at said sensed geographic position; and
    broadcast wave receiving means coupled to the channel determining means for receiving broadcast waves through said reception channel determined by the channel determining means.

11. The broadcast wave receiving system according to claim 10, further comprising means for sensing a reception sensitivity of the reception channel in said broadcast wave receiving means, wherein said channel map data includes a list of at least one channel for the selected broadcast station in an unstable reception area where a broadcast reception of the selected broadcast station is unstable, and wherein when the sensed geographic position of the moving body is in the unstable reception area of the selected broadcast station, said channel determining means reads a list of the at least one channel of the selected broadcast station from said broadcast station data memory and automatically determines one of the at least one channel having a highest reception sensitivity as the reception channel to be used by said broadcast wave receiving means to receive the broadcast waves.

12. The broadcast wave receiving system according to claim 10, further comprising sensing means for sensing a reception sensitivity of the reception channel in said broadcast wave receiving means, wherein said channel determining means determines that the moving body is in an unstable reception area of the selected broadcast station where broadcast reception is unstable, and wherein when the reception sensitivity sensed by said sensing means becomes equal to or lower than a predetermined reference level, the channel determining means reads a list of at least one channel allocated to said selected broadcast station at the unstable reception area from said broadcast station data memory based on the sensed geographic of the moving body and automatically determines one of the at least one channel having the reception sensitivity greater than the predetermined reference level as the reception channel to be used by said broadcast wave receiving means to receive the broadcast waves.

13. The broadcast wave receiving system according to claim 10, further comprising means for sensing a reception sensitivity of the reception channel in said broadcast wave receiving means, wherein said channel map data includes a list of at least one channel of the selected broadcast station for the broadcast area, and said channel determining means responding to the sensed geographic position of the moving body by reading a list of at least one channel of the selected broadcast station from said broadcast station data memory and by automatically determining one of the at least one channel having a highest reception sensitivity as the reception channel to be used by said broadcast wave receiving means to receive the broadcast waves.

14. The broadcast wave receiving system according to claim 10, wherein said broadcast station data memory stores the channel map data of a receivable broadcast station allocated to the broadcast area and said broadcast wave receiver includes broadcast station data searching means coupled to said position sensing means and said broadcast station data memory for responding to said sensed geographic position of the moving body by searching the channel map data in said broadcast station data memory and by reporting to a user a channel of the receivable broadcast station at the sensed geographical position of the moving body.

15. The broadcast wave receiving system according to claim 14, further comprising search input means for inputting a search command, wherein said broadcast station data searching means is coupled to search means and responds to said search command by reporting the channel map data of the receivable broadcast station to the user.

16. The broadcast wave receiving system according to claim 10, wherein said position sensing means is a position sensor in a navigation system.

17. The broadcast wave receiving system according to claim 15, further comprising reporting means for reporting information to the user through at least one of images and sounds, wherein said broadcast station data searching means is coupled to the reporting means and reports the channel map data of said receivable broadcast station to the user through said reporting means.

18. The broadcast wave receiving system according to claim 17, wherein said reporting means includes image display means mounted on the moving body for showing the images representing the channel map data of said receivable broadcast station.

19. The broadcast wave receiving system according to claim 17, wherein said reporting means includes sound generating means mounted on the moving body to output the sounds that correspond to the channel map data of said receivable broadcast station.

20. The broadcast wave receiving system according to claim 17, wherein said broadcast station data memory stores the channel map data of the receivable broadcast station allocated to the broadcast area, said selection input means inputting the selection command for any TV broadcast station, said channel determining means responding to said sensed geographic position of the moving body and said selection command by searching the channel map data in said broadcast station data memory and by determining the reception channel of a selected TV broadcast station at said sensed geographic position of the moving body, said broadcast wave receiving means receiving TV broadcast waves from said selected TV broadcast station through the reception channel.

21. The broadcast wave receiving system according to claim 10, wherein said broadcast station data memory stores the channel map data of a receivable broadcast station allocated to the broadcast area, said selection input means inputs the selection command for any TV broadcast station, said channel determining means responding to said sensed geographic position of the moving body and said selection command by searching the channel map data in said broadcast station data memory and by determining the reception channel of a selected TV broadcast station at said sensed geographic position of the moving body, said broadcast wave receiving means receiving TV broadcast waves from said selected TV broadcast station through the reception channel.

22. The broadcast wave receiving system according to claim 21, further comprising image display means for showing images corresponding to said received TV broadcast waves.

23. The broadcast wave receiving system according to claim 22, further comprising a radio set mounted on said moving body and transmitting means for wirelessly transmitting radio signals corresponding to said received TV broadcast waves to said radio set, whereby said radio set outputs sound signals corresponding to the radio signals through a sound generating portion of said radio set.

24. The broadcast wave receiving system according to claim 23, further comprising an unused wave data memory which stores channel map data of used and unused broadcast waves allocated to the broadcast area and channel determining means responding to said sensed geographic position of the moving body searching said unused wave data memory and by determining an unused channel from the unused channel map data for radio signal transmission, said broadcast wave receiving means wirelessly transmits radio signals corresponding to said received TV broadcast waves to said radio set using the unused channel.

25. The broadcast wave receiving system according to claim 24, further comprising planned route input means for inputting a planned route which the moving body will take, the channel determining means responding to the inputted planned route by searching the unused channel map data in said unused wave data memory and by determining an unused channel from the unused channel map data for radio signal transmission along said planned route and by storing the unused channel in a memory, and channel switching means coupled to the position sensing means, the channel determining means and the transmitting means, for switching to the unused channel, the channel switching means responding to said sensed geographic position of the moving body by recalling the unused channel corresponding to the sensed geographic position stored in said memory and by switching to the recalled unused channel in said transmitting means for the radio signal transmission.

26. A broadcast wave receiving system for a moving body comprising:

position sensing means for sensing a geographic position of the moving body;

a broadcast station data memory which stores channel map data of at least one of a broadcast station and affiliates thereof allocated to a broadcast area for said broadcast station and affiliates thereof, respectively;

selection input means for inputting a selection command for selecting the broadcast station;

channel determining means coupled to the position sensing means, the broadcast station data memory and the selection input means for searching the channel map data in said broadcast station data memory based on said sensed geographic position of the moving body and said selection command, and for determining a reception channel of a selected broadcast station at said sensed geographic position;

broadcast wave receiving means coupled to the channel determining means for receiving broadcast waves through said reception channel determined by the channel determining means;

an unused wave data memory which stores channel map data of used and unused broadcast waves allocated to the broadcast area;

channel determining means responding to said sensed geographic position of the moving body by searching said unused wave data memory and by determining an unused channel from the unused channel map data for radio signal transmission;

a radio set mounted on said moving body; and transmitting means for wirelessly transmitting radio signals corresponding to said received broadcast waves using said unused channel and for outputting said radio signals to produce sounds through a sound generating portion of said radio set.

27. A radio signal transmitter for a moving body, comprising:

a position sensor that senses a geographic position of the moving body;

an unused wave data memory that stores channel map data of used and unused channels allocated to a broadcast area;

a channel determining device that searches the unused channel map data based on a sensed geographic position of the moving body to identify a first unused channel; and a transmitter that wirelessly transmits radio signals using the first unused channel, the radio signals corresponding to sound signals from a sound source and being transmitted to a radio set that produces sounds through a sound generating portion of the radio set based on the radio signals.

28. The radio signal transmitter according to claim 27, further comprising:

a planned route input device that inputs a planned route that the moving body will take, the channel determining device searching the unused channel map data in the unused wave data memory based on the planned route to identify unused channels for a radio signal transmission along the planned route, the unused channels being stored in a memory; and a channel switch coupled to the position sensor, the channel determining device and the transmitter for switching the transmitter to one of the unused channels, the channel switch recalling a second unused channel of the unused channels from the memory and switching the transmitter to the second unused channel for transmitting the radio signal based on the geographic position sensed by the position sensor.

29. The radio signal transmitter according to claim 27, wherein the position sensor is a position sensor of a navigation system.

30. A radio signal transmitter for a moving body, comprising:

a position sensor that senses a geographic position of the moving body;

a broadcast wave receiver that receives broadcast waves;

an unused wave data memory that stores channel map data of used and an unused channels allocated to the broadcast area;

a channel determining device that searches the unused channel map data based on a sensed geographic position of the moving body to identify a first unused channel; and a transmitter that wirelessly transmits radio signals using the first unused channel, the radio signals corresponding to received broadcast waves and being transmitted to a radio set that produces sounds through a sound generating portion of the radio set based on the received broadcast waves.

31. The radio signal transmitter according to claim 30, further comprising:

a planned route input device that inputs a planned route that the moving body will take, the channel determining device searching the unused channel map data in the unused wave data memory based on the planned route to identify unused channels for a radio signal transmission along the planned route, the unused channels being stored in a memory; and a channel switch coupled to the position sensor, the channel determining device and the transmitter for switching the transmitter to one of the unused channels; the channel switch recalling a second unused channel of the unused channels from the memory and switching the transmitter to the second unused channel for transmitting the radio signal based on the geographic position sensed by the position sensor.

32. The radio signal transmitter according to claim 30, wherein the position sensor is a position sensor of a navigation system.

* * * * *